United States Patent
Moriwaki

(10) Patent No.: US 6,665,246 B2
(45) Date of Patent: Dec. 16, 2003

(54) OPTICAL DISK APPARATUS

(75) Inventor: Isamu Moriwaki, Toyonaka (JP)

(73) Assignee: Ricoh Company, Ltd., Tokyo (JP)

( * ) Notice: Subject to any disclaimer, the term of this patent is extended or adjusted under 35 U.S.C. 154(b) by 295 days.

(21) Appl. No.: 09/841,466

(22) Filed: Apr. 24, 2001

(65) Prior Publication Data

US 2001/0055249 A1 Dec. 27, 2001

(30) Foreign Application Priority Data

Apr. 25, 2000 (JP) ........................................ 2000-124203

(51) Int. Cl.$^7$ ................................................ G11B 5/09
(52) U.S. Cl. .................. 369/47.55; 369/53.34
(58) Field of Search .................... 369/47.15, 47.28, 369/47.3, 47.31, 47.48, 47.55, 53.24, 53.34, 53.37, 53.44, 53.45, 59.2, 47.39, 47.36

(56) References Cited

U.S. PATENT DOCUMENTS 5,991,250 A * 11/1999 Kim ........................ 369/47.28

FOREIGN PATENT DOCUMENTS

JP 1049990 2/1998

* cited by examiner

*Primary Examiner*—Paul W. Huber

(57) ABSTRACT

An optical disk apparatus for use with a recordable optical disk, which is provided with a clock signal generator configured to generate standard clock signals for data recording such that the location of the data recording restart following an interruption on the optical disk coincides precisely with that of finish of the previous recording. Included in the clock signal generator, a second frequency and phase detector is configured to compare the frequency and phase of a frame synch signal with those of the signal obtained by the 1/588 division of channel clock signals, and control a variable divider to set its dividing ratio 1/50 so as to increase the frequency of channel clock signals, when the interval between frame synch signals is smaller than the period of the 588 channel clocks; while to set the ratio 1/48 to decrease the frequency of channel clock signals, when the interval is larger than the above period.

11 Claims, 5 Drawing Sheets

OPTICAL DISK APPARATUS

BACKGROUND

1. Field

This patent specification relates to an optical disk apparatus in use for recordable optical media such as CD-R, CD-RW and other similar media, and more particularly, to techniques of generating standard clock signals for properly timing the data recording.

2. Discussion of the Background

In optical disk apparatuses in use for recordable optical media such as a Compact Disk-Recordable (CD-R), CD-Recordable (CD-RW), for example, data recording is carried out in a predetermined data format, in which standard recording clock signals (or standard clock signals for data recording) are utilized, that are formed synchronous with standard clock signals. The standard clock signals, in turn, are generated on the basis of the signals from a crystal oscillator, for example.

For optical recording media such as CD-R, CD-RW, the format for data recording is specified in a book of standards, Orange Book. It has been known that, as long as the whole data recording is completed without interruption, recording can be achieved without problems with the above noted method utilizing standard recording clock signals which are formed synchronous with standard clock signals based on those from the crystal oscillator.

FIG. 5 is a block diagram illustrating the major parts of a clock signal generator previously known for generating standard clock signals for data recording.

Referring to FIG. 5, a clock signal generator 100 comprises a phase locked loop (PLL) circuit which is configured to detect the differences in both frequency and phase between the following two signals by means of a frequency and phase detector (PFD) 104 so as to control a voltage control oscillator (VCO) 102; a first signal being generated based on 33.8688 MHz clock signal, which is output from a crystal oscillator (not shown) and then input to CLKIN terminal, having a frequency divided by 1/48 by a 1/48 divider 101, and a second signal output from the VCO 102 and then divided by 1/49 by a 1/49 divider 103.

The signal output from VCO 102, which has a frequency of 34.5744 MHz, when PLL locked, is subsequently frequency divided by 1/8 with a 1/8 divider 105, and then output as channel clock signals to serve as standard clock signals during data writing.

Incidentally, resistors 106, 107 and capacitors 108, 109, constitute a low-pass filter, and also serve as a phase compensator for carrying out phase compensation of the signals output from PFD 104 and then outputting these compensated signals to VCO 102.

Even after providing the above noted clock signal generator, there still exist problems such as, for example, so called buffer under-error, which will be described herein below.

In order to continue data recording without any interruption as indicated above, data to be recorded must be transferred from a host computer continuously with a rate the same or greater than that of data writing into optical disks. Therefore, when the data transfer from the host is interrupted for some reason, failure in data writing results, generally known as the buffer under-error.

A method is proposed in Japanese Laid-Open Patent Application No. 10-49990 to alleviate the above noted difficulty, in which data recording is intentionally halted when any interruption is foreseen, until a sufficient amount of data has been transferred from a host computer. Upon completing the transfer, the recording is resumed starting from the location on the disk that follows the location at which the previous recording was interrupted. In this method, however, the location of the restart may not necessarily coincide precisely with that of the previous interruption because of fluctuation of disk rotation, for example.

SUMMARY

Accordingly, it is an object of the present disclosure to provide an optical disk apparatus having most, if not all, of the advantages and features of similar employed apparatuses, while eliminating at least some of the aforementioned disadvantages.

It is another object of the present disclosure to provide an optical disk apparatus provided with a clock signal generator configured to generate standard clock signals for data recording such that the location of the data recording restart following an interruption on the optical disk coincides precisely with that of finish of the previous recording.

The following brief description is a synopsis of only selected features and attributes of the present disclosure. A more complete description thereof is found below in the section entitled "Description of Preferred Embodiments".

An optical disk apparatus in use for recordable optical disk disclosed herein includes at least a clock signal generator configured to generate standard clock signals for properly timing data recording such that the location of data recording restart following an interruption on the optical disk coincides precisely with that of finish of a previous recording.

The clock signal generator includes a voltage control oscillator for generating and then outputting a clock signal having a frequency corresponding to an input control voltage, a variable divider for frequency dividing the clock signal output from the voltage control oscillator with a dividing ratio that is variable corresponding to an input control voltage, a fixed divider for frequency dividing a standard clock signal having a predetermined frequency with a predetermined dividing ratio, a frequency and phase detector for comparing both frequency and phase between a first signal generated by being frequency divided by the fixed divider and a second signal generated by being frequency divided by the variable divider, and then outputting a control voltage corresponding to comparison results; and a dividing ratio controller for comparing both frequency and phase between frame synch signal, that are provided for each frame data on the optical disk and acquired during playback period of recorded data, and a clock signal output from the voltage control oscillator, and then controlling the variable divider to have a dividing ratio that is variable corresponding to comparison results.

In addition, the dividing ratio controller is configured to control the dividing ratio in the variable divider such that both frequency and phase of the clock signal output from the voltage control oscillator synchronize with those of the frame synch signal, and that the dividing ratio is a predetermined value when no frame synch signal is input thereinto.

The present disclosure and features and advantages thereof will be more readily apparent from the following detailed description and appended claims when taken with drawings.

DESCRIPTION OF THE PREFERRED EMBODIMENTS

In the detailed description which follows, specific embodiments of the apparatus and method are described, which are particularly useful for data record and playback in use for recordable optical disks. It is understood, however, that the present disclosure is not limited to these embodiments. For example, the use of clock signal generator, and frequency and phase detector disclosed herein may also be adaptable to any form of information recording and playing back. Other embodiments and variations will be apparent to those skilled in the art upon reading the following description.

Figure 1:
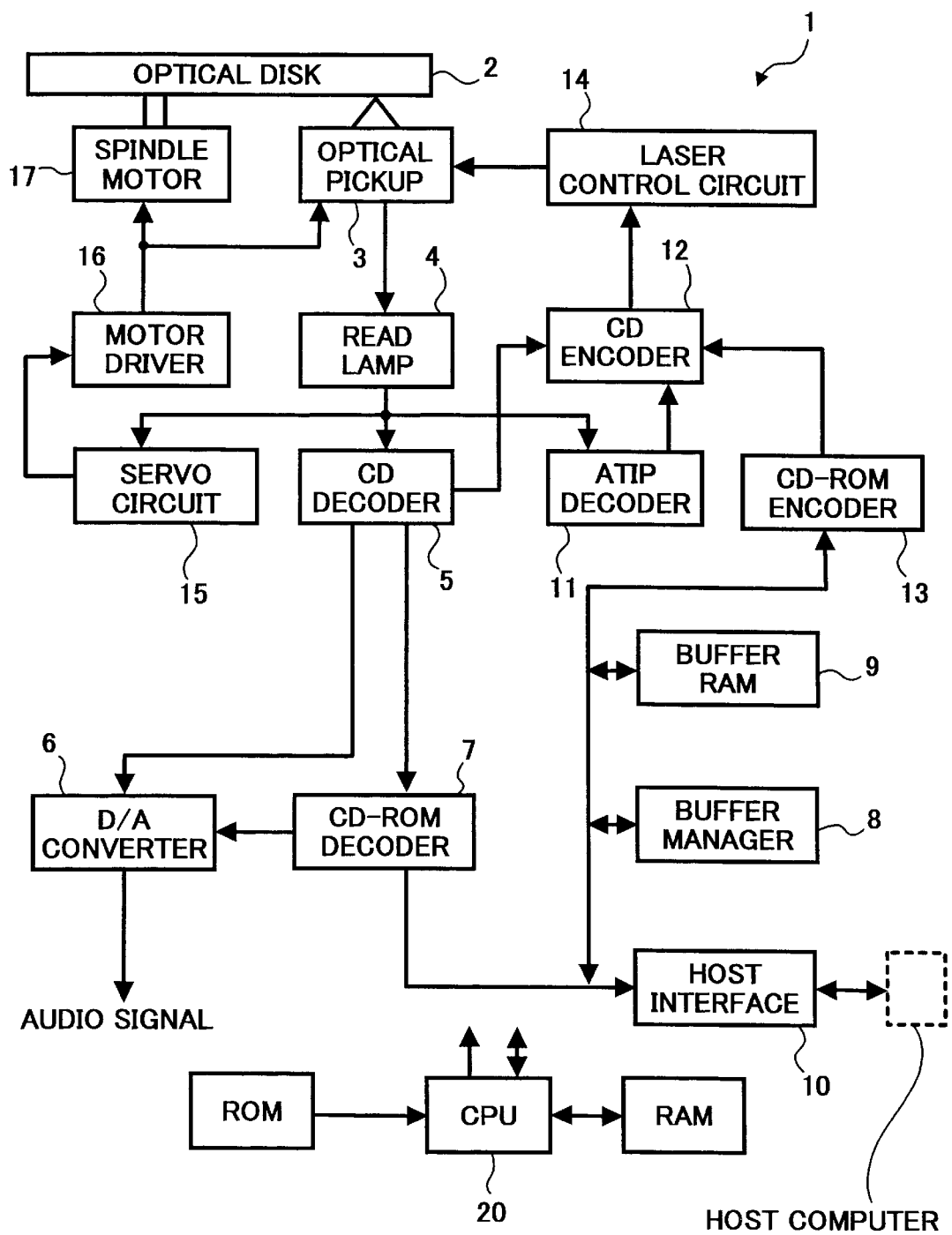
FIG. 1 is a block diagram illustrating an optical recording apparatus according to one embodiment disclosed herein.

FIG. 1 is a block diagram illustrating an optical recording apparatus according to one embodiment disclosed herein, in which a CD-R is primarily exemplified as a recordable optical disk.

Referring to FIG. 1, being provided in the recording apparatus, a optical pickup unit 3 includes at least a semiconductor laser, optical system, focusing actuator, tracking actuator, photo-detector and position sensor (not shown), thereby carrying out data record and playback onto an optical disk 2 through laser beam irradiation.

Signal data readout by the pickup unit 3 are amplified and binary coded by a read amplifier 4. The thus amplified and coded data are subjected to eight to fourteen modulation (EFM) and cross interleave Reed Solomon code (CIRC) operation (i.e., de-interleave, error correction and others), and then decoded. In the case where the decoded data are musical ones (which are hereinafter referred to as CD data), these data are D/A converted by a D/A converter 6 and then output as audio signals.

When the decoded data are in use for a personal computer (as CD-ROM data), on the other hand, the data are output to a CD-ROM decoder 7. The CD-ROM decoder 7, in turn, operates on the thus input data, causing them to be stored in a buffer RAM 9 by way of a buffer manager 8 and also subjected to error correction processes to improve their reliability. The transfer of these data in the above steps such as reading out, and updating the content after the error correction, of the data stored in the buffer RAM 9, are carried out by way of buffer manager 8.

Following the error correction by the CD-ROM decoder 7, data are readout again by way of the buffer manager 8 to be transferred to an external computer through a host interface 10, which serves to interface between the host computer HC and is prepared according to the standards such as ATA Packet Interface (ATAPI) or small computer systems interface (SCSI).

On the other hand, absolute time in pre-groove (ATIP) data are built-in during manufacturing onto non-recorded optical disks and readout during data recording into non-recorded portions on the disk by pickup 3. Namely, wobble signals on the disk are readout by pickup 3, amplified and binary coded by a read amplifier 4, and output to ATIP decoder 11.

From the input ATIP data, the ATIP decoder 11 operates to decode and create synchronizing signals (or ATIP synch) as well as time information (or ATIP time information), and subsequently output to the CD encoder 12.

The CD encoder 12 utilizes the input ATIP data as the data essential for detecting the positions of data recording in non-recorded area on the optical disk 2. The CD encoder 12 therefore serves to enable data recording starting from right location on the optical disk by utilizing the ATIP synch and ATIP time information.

For the non-recorded area on the optical disk 2, as noted above, the time information for indicating proper positions on the disk can be obtained solely from the ATIP data.

In contrast, for recorded areas on the optical disk 2, the ATIP decoder 11 might not able to create proper ATIP synch and time information, because of less satisfactory quality of wobbling signals. In such a case, since subcode data are recorded in the recorded areas on the disk 2 in addition to the sub-code synch as synchronizing signals, the CD decoder 5 may operate to process the subcode data to thereby output time information on the disk 2 to CD encoder 12. Namely, for recording in recorded areas on the disk 2, the CD encoder 12 may operate to obtain time information for indicating proper positions utilizing the subcode data.

The data to be recorded into the disk 2 are transferred from a host computer HC to buffer RAM 9 by way of buffer manager 8. The CD-ROM encoder 13 operates to readout the data stored in buffer RAM 9 by way of buffer manager 8; affix error correction codes, error detection and correction (EDC) codes, synch codes, and header information, and subsequently feed back these data to the buffer RAM 9 to be updated.

In addition, the CD-ROM encoder 13 operates to readout the thus prepared data in the buffer RAM 9 by way of buffer manager 8 and write into a CIRC operation RAM (not shown). The CD encoder 12 carries out the CIRC operation on the data in CIRC operation RAM, affixing error correction codes, and inter-leave processing. The thus prepared data are further subjected to eight-to-fourteen modulation (EFM) and are output, subsequently. The data output from CD encoder 12 are recorded onto the optical disk 2 by way of a laser control circuit 14 and the pickup 3.

Also, wobble signals obtained from the disk 2 are input into a servo circuit 15 by way of pickup 3 and read amp 4, and rotation control signals then generated by the servo circuit 15 are fed to a spindle motor by way of a motor driver 17.

Incidentally, the CD decoder 5, CD-ROM decoder 7, host computer 10, ATIP decoder 11, CD encoder 12 and CD-ROM encoder 13 are controlled by the CPU 20.

Figure 2:
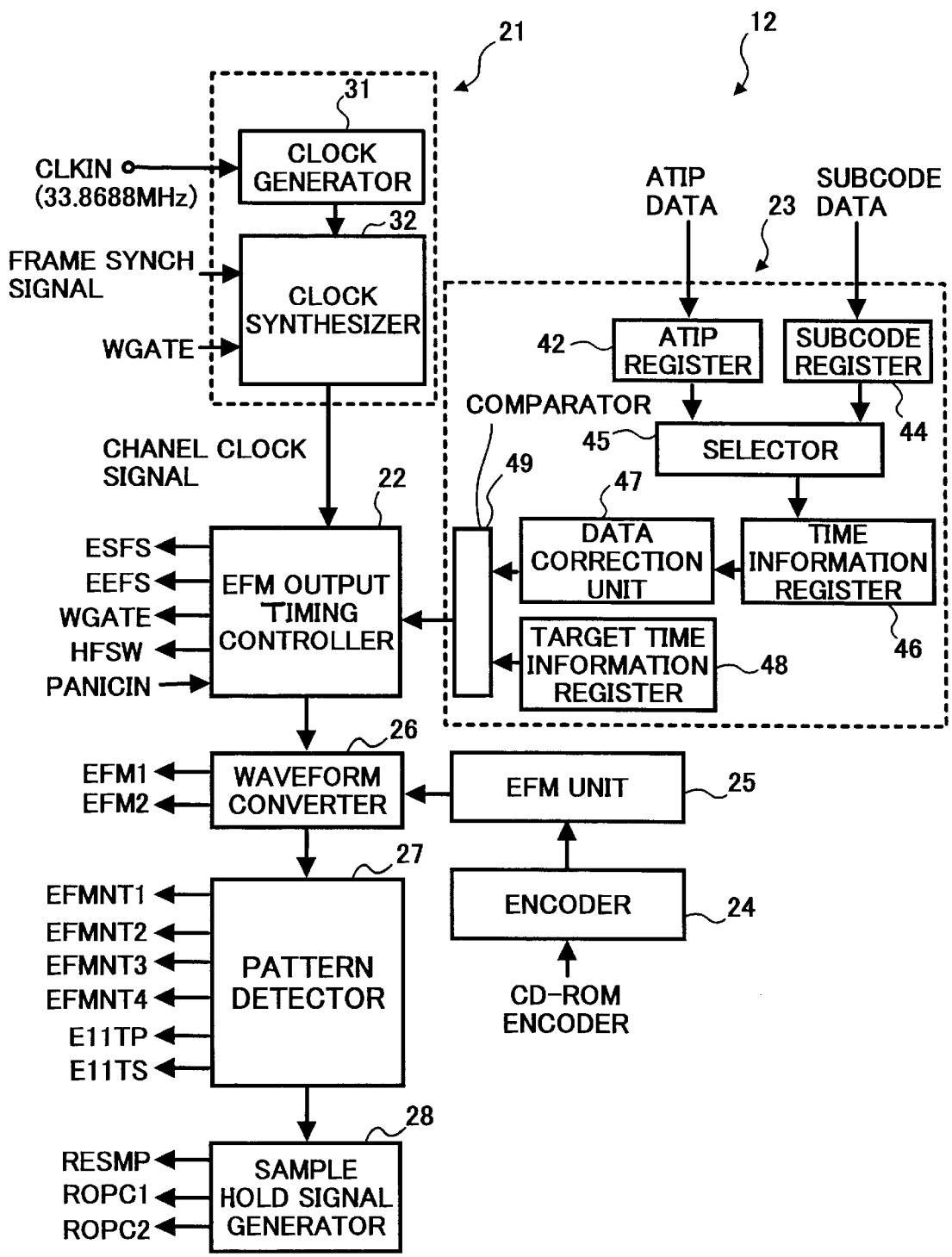
FIG. 2 is a block diagram illustrating the major parts of the CD encoder of FIG. 1.

FIG. 2 is a block diagram illustrating the major parts of the CD encoder 12 of FIG. 1.

Referring to FIG. 2, the CD encoder 12 includes a clock signal generator 21, EFM output timing controller 22, and time information determining unit 23.

The clock signal generator 21 is configured to generate channel clock signals based on standard clock signals input from the exterior, which serve as clock signals in the CD encoder 12, and subsequently output these signals to respective units. The EFM output timing controller 22 is configured to generate and then output standard signals to control a laser control circuit 14. In addition, the time information determining unit 23 is configured to determine whether either ATIP time information, input by an ATIP decoder 11, or time information, obtained from sub-code data input by CD decoder 5, coincides with predetermined time information.

The CD encoder 12 further includes an encode unit 24 for encoding, in a predetermined manner, the data to be written, which are input from CD-ROM encoder 13; an EFM unit 25 for generating EFM signals thorough EFM processing of the written data encoded by encode unit 24; a waveform transformation unit 26 for outputting the signals to laser control circuit 14, which are formed through waveform transformation, or the so-called strategy transformation, of EFM signals generated by the EFM unit 25; and a pattern detection unit 27 for detecting signal patterns necessary for laser control out of those strategy transformed by the waveform transformation unit 26, generating and subsequently outputting the thus prepared signals to laser control circuit 14.

Incidentally, a sample hold signal generator 28 serves as the circuit for sample holding servo signals as well as other similar signals during data writing.

The clock signal generator 21 includes a clock generator 31 for generating predetermined clock signals based on standard clock signals which are input from the exterior, and a clock synthesizer 32. The clock synthesizer 32 is formed with PLL and other similar circuits, to thereby generate, from the clock signals generated by clock generator 31, channel clock signals that serve as standard clock signals within the CD encoder 10, and subsequently output these signals to respective parts of encoder 10.

The time information determining unit 23 includes an ATIP register 42 for temporally storing the ATIP time information, and a subcode register 44 for temporally storing time information of the subcode data which are input from the CD decoder 5.

In addition, the time information determining unit 23 further includes a selector 45 for selecting and then outputting the data stored in either ATIP register 42 or subcode register 44, a time information register 46 for storing the data selected by the selector 45 as updated time information, and a data correction unit 47 for generating internally corrected values through correcting the data stored in the time information register 46.

Since it takes a certain time for the ATIP and subcode data from being readout by the pickup 3 to input into CD encoder 12, the data correction by the data correction unit 47 is provided so as to compensate the above noted time difference, which is achieved by correcting the data to those corresponding to the time increased by a predetermined time length.

Further, the time information determining unit 23 additionally includes a target time information register 48 and a comparator 49.

The target time information register 48 receives time information indicative of write positions, which is input from the host computer HC during data write periods.

The comparator 49 serves to constantly compare the time, which corresponds to the above noted internally corrected values generated by data correction unit 47, with that indicated by the data stored in time information register 48, generate control signals for controlling EFM output timing based on the results from the comparison, and subsequently output these signals to EFM output timing controller 22.

The data in ATIP register 42 are stored into time information register 46 by way of selector 45. The data correction unit 47 serves to readout time information stored in time information register 46, generate internally corrected values corresponding to the thus readout time information, and then output these values to comparator 49.

When the internally corrected values output from data correction unit 47 coincide with the data output from target time information register 48, the comparator 49 outputs control signals corresponding to the comparison results to EFM output timing controller 22. The output timing controller 22 serves to generate and then output various timing signals necessary for write steps upon the coincidence of the aforementioned corrected values and data, to thereby achieve data writing into the optical disk 2.

Figure 3:
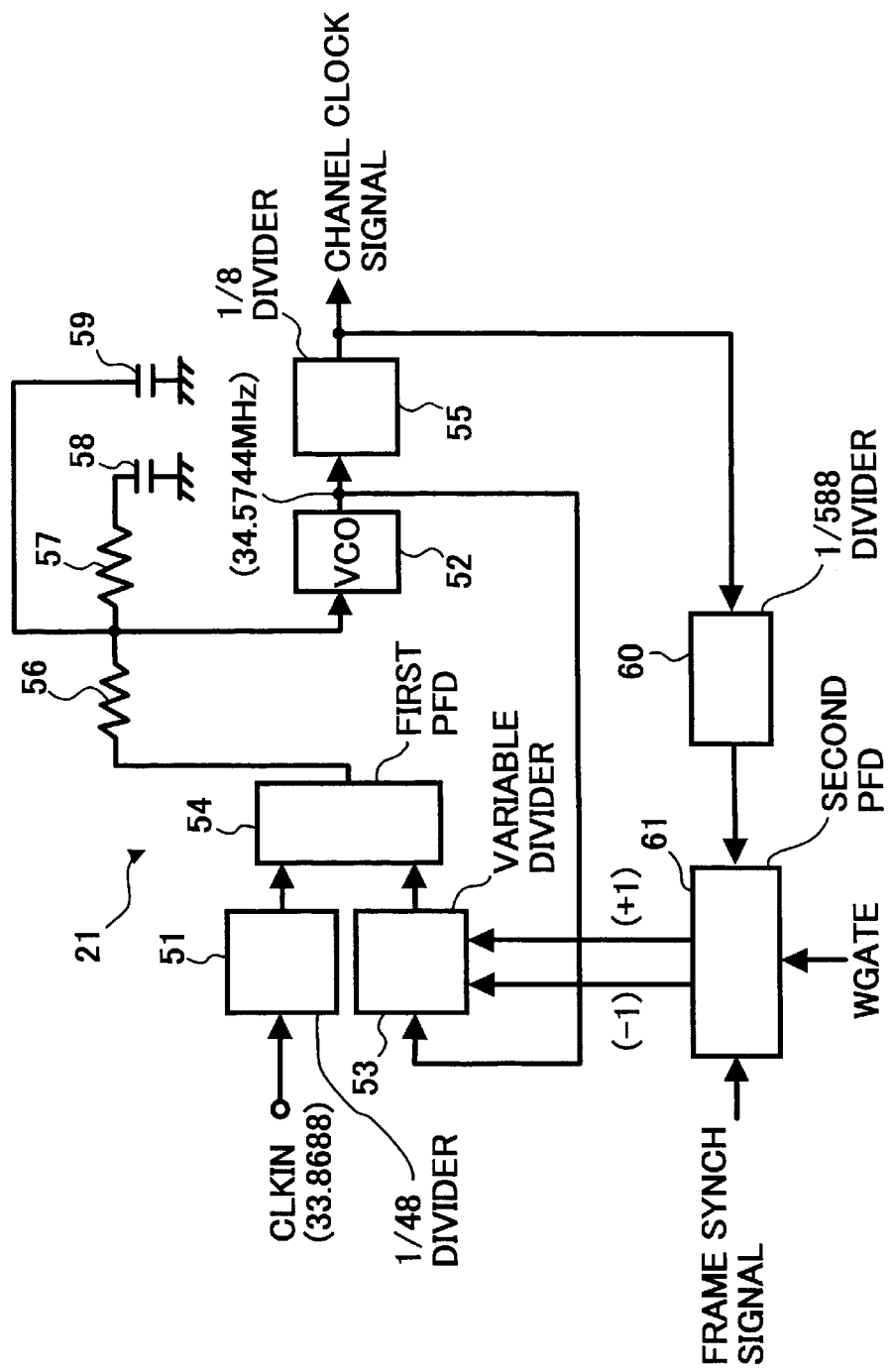
FIG. 3 is a block diagram illustrating the major parts of the clock signal generator of FIG. 2.

FIG. 3 is a block diagram illustrating the major parts of the clock signal generator 21 of FIG. 2.

Referring to FIG. 3, the clock signal generator 21 constitutes a phase locked loop (PLL) circuit which is configured to detect the differences in both frequency and phase between the following two signals by a first frequency and phase detector (PFD) 54 for controlling a voltage control oscillator (VCO) 52; a first signal being generated, based on 33.8688 MHz clock signal which is output from a crystal oscillator (not shown) and then input to CLKIN terminal, having a frequency divided by 1/48 with a 1/48 divider 51, and a second signal output from the VCO 52 and then divided by a variable divider 53.

The signal output from the VCO 52, which has a frequency of 34.5744 MHz, when PLL locked, is subsequently frequency divided by 1/8 by a 1/8 divider 55, and then output as channel clock signals to serve as standard clock signals during data writing.

In addition, resistors 56, 57 and capacitors 58, 59, constitute a low-pass filter, which serves as a phase compensator for carrying out phase compensation of the signals output from first PFD 54 and then outputting these compensated signals to the VCO 52.

Further, the clock signal generator 21 additionally includes a 1/588 divider 60 for dividing the channel clock signals output from the 1/8 divider 55, and a second PFD 61. The second PFD 61 is configured to detect frequency and phase differences between two signals, to thereby control the operation of the voltage control oscillator (VCO) 52, the one being the signal obtained as above by the 1/588 divider 60 and the other output from the CD decoder 5 as a frame synch signal.

The second PFD 61, therefore, operates as a controller, or dividing ratio controller, for controlling a dividing ratio corresponding to the detection results.

There will be detailed herein below the format for recording data into the optical disk 2.

In data recording into a compact disk (CD), the data for the time period of one second are divided into those for every 1/75 second, in which each of them forms one block. One block then counts as one sector in a CD-ROM. Since 4 bytes (i.e., 16 bits×stereo) are allocated to each of 44.1 kHz sampling blocks for CD data, the number of data per block amounts to (44100/75)×4=2352 bytes. These data recorded into the CD are further divided into a plurality of frames each consisting of 24 bytes, to thereby results in 2352/24=98 frames for one block.

To the above noted 24 bytes for each frame, 8 bytes of CIRC error correction codes and one byte of subcode data as control data are both supplemented, to thereby add up to 33 bytes. And each byte of the data is subjected to the EFM and added with 3 bits as margin bits. Further added to designate frame boundaries are 24 bits of frame synch pattern (or SynchHeader) and 3 bits of another set of margin bits. Therefore, the number of data in each frame amount to 33×(14+3)+(24+3)=588 bits (channel clocks).

A frame synch signal is then generated usually once every 588 channel clocks thorough detecting the frame synch pattern, which is previously added to each frame data as above described, by means of a pattern coincidence circuit in CD decoder 5.

Corresponding to the above noted structure of recorded data, the second PFD 61 operates to compare the frequency and phase of a frame synch signal with those of the signal obtained by the 1/588 division of channel clock signals (i.e., 34.5744 MHz for the octa-speed (8×) recording), and then output the signals, which are formed on the basis of the comparison results, to the variable divider 53 for use in the variable control of the dividing ratio.

The variable divider 53 carries out frequency division with the ratio of 1/48, 1/49 or 1/50, depending on the thus input control signals from the second PFD 61, and subsequently outputs resulting signals to first PFD 54.

To be more specific, when the interval between frame synch signals is smaller than the period of the 588 channel clocks, the second PFD 61 outputs, at the timing for starting the frame synch signal, +1 signal (or pulse signal) as the control signal for the variable divider 53 to set its dividing ratio 1/50; while −1 signal (or pulse signal) is output to set the ratio 1/48, when the interval is larger than the above period. In addition, when neither +1 or −1 signal is input, the variable divider 53 operates as a 1/49 divider for clock signals input from the VCO 52.

On the other hand, when data recording is carried out in pre-recorded areas of the disk, in which no frame synch signal is input to the second PFD 61 for that period, a high level write gate signal WGATE is input to the second PFD 61 of FIG. 2, that is generally input from EFM output timing controller 22 when write steps are initiated.

Upon receiving the high level write gate signal WGATE, the second PFD 61 ceases to output either +1 or −1 signal to variable divider 53. During this period, the variable divider 53 therefore operates as a 1/49 divider and then outputs its resulting signals. That is, the variable divider 53 operates as a 1/49 divider for the period of recording in pre-recorded area of the disk.

Figure 4:
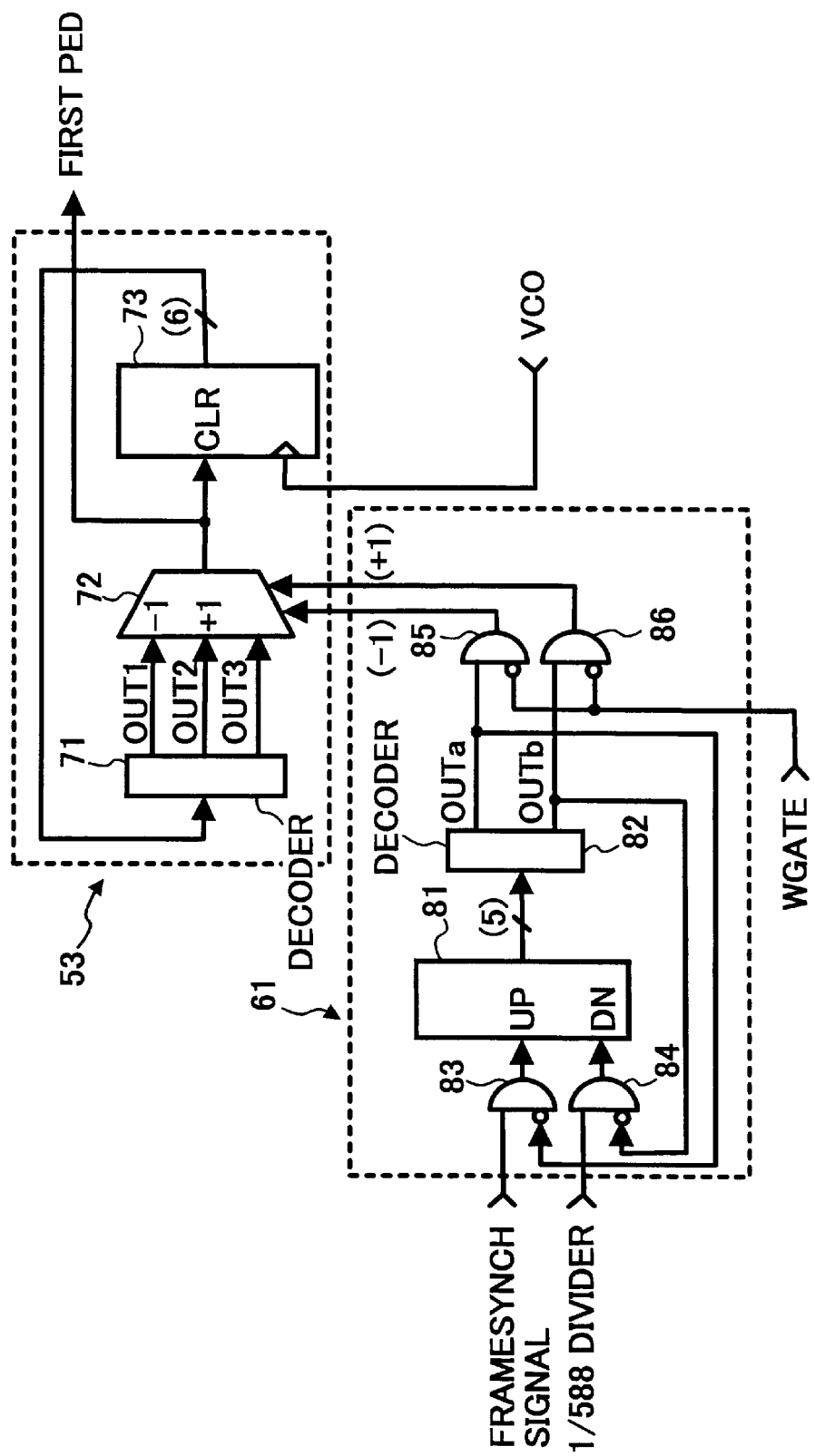
FIG. 4 is a block diagram illustrating the major parts of the variable divider and second PFD of FIG. 3.
Figure 5:
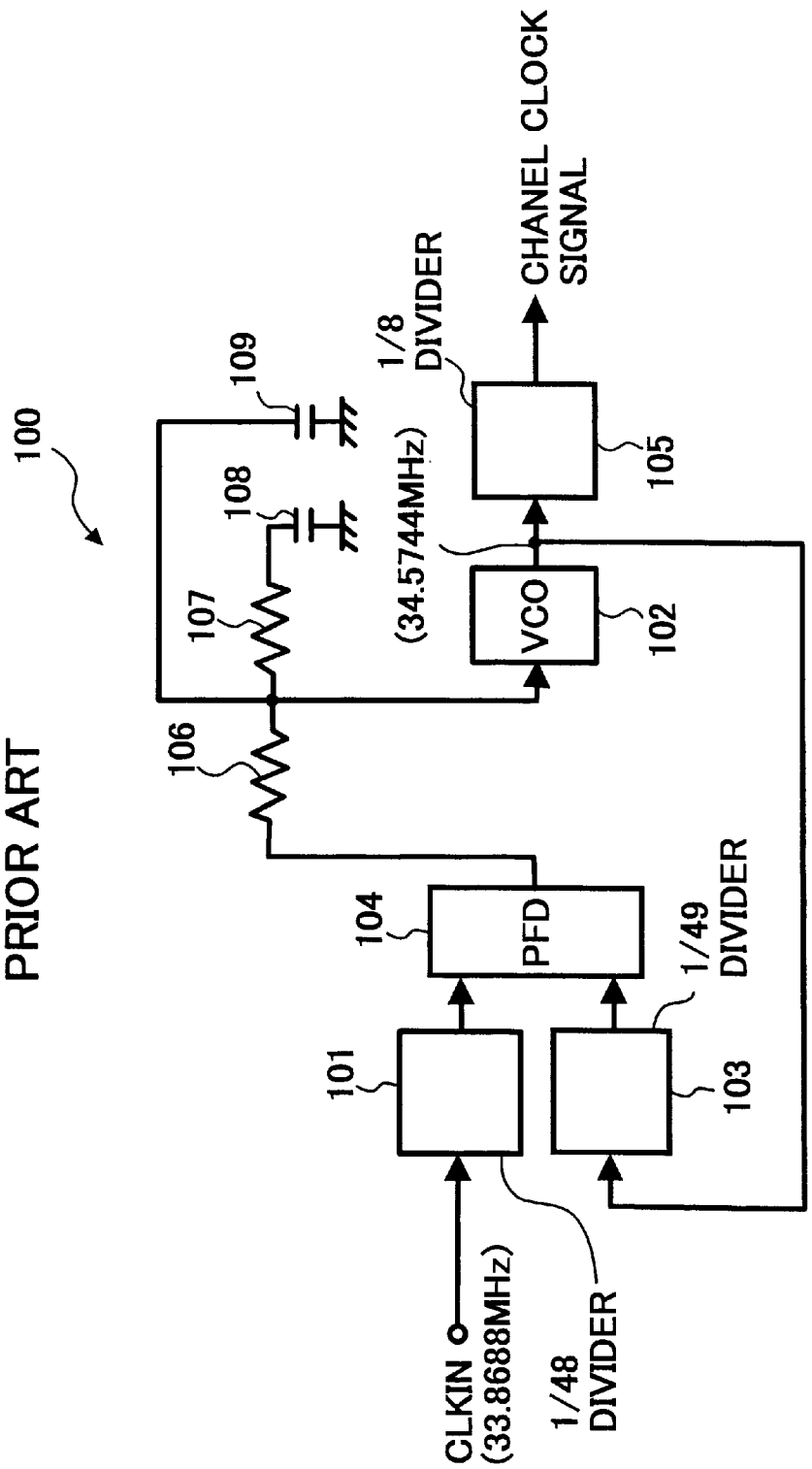
FIG. 5 is a block diagram illustrating the major parts of a clock signal generator previously known for generating standard clock signals for data recording.

FIG. 4 is a block diagram illustrating the major parts of the variable divider 53 and second PFD 61 of FIG. 3.

Referring to FIG. 4, the variable divider 53 includes a decoder 71, selector 72 and counter 73, and the second PFD 61 includes an up/down counter 81, decoder 82 and counters 83–86.

In the variable divider 53, signals from the VCO 52 are input to the clock input terminal of the counter 73, and counting steps are carried out by counter 73 based on signals input from the VCO 52.

The 6-bits values counted in counter 73 are fed to decoder 71, and subsequently decoded. In addition, the decoder 71 is provided with output terminals OUT1, OUT2 and OUT3, in which the output terminal OUT1 outputs a high level signal each time when a decoded value reaches 47, the terminal OUT2 does the same when the value reaches 48, and the output terminal OUT3 does so when the value reaches 49, respectively.

The output terminals OUT1, OUT2 and OUT3, of the decoder 71 are respectively connected to corresponding terminals of the selector 72.

The selector 72 operates to select exclusively one terminal out of the above three to receive the input signal, depending on the control signal input from the second PFD 61. The thus selected signal is subsequently output to both clear signal input terminal CLR and first PFD 54. When a high level signal is input into clear signal input terminal CLR, the counter 73 operates to reset to zero, or its initial value.

Namely, the variable divider 53 is configured to operate as a 1/48 divider when the terminal OUT1 of the selector 72 is selected. Similarly, it operates as a 1/49 divider when OUT2 is selected, and as a 1/50 divider when OUT3 is selected.

Each of AND circuits 83–86 in the second PFD 61 is a double-terminal AND circuit which is provided at one terminal with an inverting function.

In AND circuit 83, the non-inverted input terminal is input with frame Synch signals and its output terminal is connected to the up-count terminal UP of up/down counter 81. In AND circuit 84, the non-inverted input terminal is input with the signals from 1/588 divider 60 and its output terminal is connected to the down-count terminal DN of up/down counter 81. In addition, the output terminal of up/down counter 81 is connected to decoder 82 and binary 5-digit numbers counted by up/down counter 81 are output to decoder 82.

The up/down counter 81 operates to increment its count every time a high level signal is input to the up-count terminal, and decrement its count upon an input to the down-count terminal. The up/down counter 81 operates not to count, however, when both up- and down-count terminals, UP and DN, are at either high or low level at the same time.

The decoder 82 operates to set its output terminal OUTa at the high level, and OUTb at low, when the count input from up/down counter 81 reaches 0 Fh, or binary '01111'. In addition, the decoder sets OUTa low and OUTb high, when 10 h or '10000' is reached.

On the other hand, the output terminal OUTa of decoder 82 is connected to the other input terminal (inverted terminal) of AND circuit 83, and the output terminal OUTb is connected to the other input terminal (inverted terminal) of the AND circuit 84. The AND circuits 83 and 84 serve as a limiter for the counting with the up/down counter 81.

Namely, when the output terminal OUTa of decoder 82 becomes high, the output terminal of AND circuit 83 becomes low regardless of the synch signals, and the up-count by the up/down counter 81 ceases. In a similar manner, when the output terminal OUTb becomes high, the output terminal of AND circuit 84 becomes low regardless of the signals from the 1/588 divider 60, and the down-count ceases.

In addition, the output terminal OUTa of decoder 82 is connected to an input terminal (non-inverted terminal) of the AND circuit 85, and the terminal OUTB is connected to an input terminal (non-inverted terminal) of the AND circuit 85. Output terminals of the AND circuits 85 and 86 are respectively connected to control signal input terminals of the selector 72, and the selector 72 is, in turn, operation controlled by 2-bit control signals constituted of the signals output from respective output terminals of the AND circuits 85 and 86.

In contrast, into the other input terminals (inverted terminals) of respective AND circuits 85 and 86, write gate signals WGATE are input, which are generated by the EFM output timing controller 22 of FIG. 2, to thereby serve as high level signals during write period for the optical disks.

When data writing is carried out in pre-recorded areas of the disk, in which the write gate signal WGATE stays high, the input of the frame synch signal ceases. As a result, when the write gate signal WGATE stays high, the output terminals of respective AND circuits 85 and 86 become low regardless of output signals from the decoder 82, and a control signal '00' is output to the control signal input terminal of the selector 72.

It should be noted herein that the selector 72 operates to select and then output the signal which is output from the output terminal OUT1 of the decoder 71, when the output terminal of the AND circuit 85 is at the high level and also that of the circuit 86 is at the low level.

In addition, when the output terminals of the AND circuits 85 and 86 are at low and high, respectively, the selector 72 operates to select and then output the signal which is output from the output terminal OUT3. Further, when the output terminals of the AND circuits 85 and 86 are both at low, the selector 72 operates to select and subsequently output the signal which is output from the output terminal OUT2.

From the above detailed description, it is seen that the variable divider 53 operates as a 1/48 divider, when the output terminal of AND circuit 85 is at high and also that of circuit 86 is at low; as a 1/50 divider, when the output terminal of AND circuit 85 is low and also that of circuit 86 is at high; and as a 1/49 divider, when the output terminals of AND circuits 85 and 86 are both at low.

Namely, the high level signal output from the output terminal of AND circuit 85 operates to create the earlier noted '−1' signal, while the high level signal output from that of AND circuit 86 operates to create the '+1' signal.

As a result, in the optical disk system disclosed herein, it becomes feasible for the second PFD 61 to compare the frequency and phase of the frame synch signal with those of the signal obtained by the 1/588 division of channel clock signals.

The second PFD 61 then operates for the variable divider 53 to set its dividing ratio to be 1/50 so as to increase the frequency of channel clock signals above normal, when the interval between frame synch signals is smaller than the period of the 588 channel clocks; while to set the ratio 1/48 so as to decrease the frequency of channel clock signals, when the interval is larger than the above period. The clock signals are thus generated by the PLL circuit including second PFD 61.

As noted earlier, the physical gap is an important factor of disk data recording, between the points of finish of previous recording and restart after interruption. By utilizing the clock signals, which are generated by the PLL circuit as described earlier, as standard signals for data recording for the optical disks, the frequency and phase of EFM data of forthcoming recording data can synchronize with those of previously recorded data.

Therefore, it becomes feasible for the above noted points to coincide precisely with each other and undue physical gap of data recording to be eliminated. As a result, failure caused by buffer under-run in data recording into optical disks can be alleviated.

It is apparent from the above description of the optical disk apparatus disclosed herein, that the second frequency and phase detector, included in the clock signal generator, operates to compare the frequency and phase of the frame synch signal with those of the signal obtained by the 1/588 division of channel clock signals, and then controls through a variable divider to set its dividing ratio to be 1/50 to thereby increase the frequency of channel clock signals than ordinary, when the interval between frame synch signals is smaller than the period of the 588 channel clocks; while to set the ratio 1/48, when the interval is larger than the above period, to thereby decrease the frequency of channel clock signals.

With the optical disk apparatus disclosed herein, it becomes therefore feasible for the location of the data recording restart following an interruption on the optical disk to coincide precisely with that of finish of the previous recording. As a result, undue failure caused by buffer under-run can be alleviated in the data recording into optical disks.

Additional modifications and variations of the present invention are possible in light of the above teachings. It is therefore to be understood that within the scope of the appended claims, the invention may be practiced other than as specifically described herein.

This document claims priority and contains subject matter related to Japanese Patent Application No. 2000-124203, filed with the Japanese Patent Office on Apr. 25, 2000, the entire contents of which are hereby incorporated by reference.

What is claimed as new and desired to be secured by Letters Patent of the United States is:

1. An optical disk apparatus for use with a recordable optical disk, comprising:

a clock signal generator configured to generate standard clock signals for timing data recording such that a location of a data recording restart following an interruption of recording on said optical disk coincides precisely with that of an end of a previous recording, wherein:

said clock signal generator comprises a voltage control oscillator for generating and then outputting a clock signal having a frequency corresponding to an input control voltage, a variable divider for frequency dividing said clock signal output from said voltage control oscillator with a dividing ratio that is variable depending on an input control voltage, a fixed divider for frequency dividing a standard clock signal having a predetermined frequency with a predetermined dividing ratio, a frequency and phase detector for comparing both frequency and phase of a first signal generated by being frequency divided by said fixed divider and a second signal generated by being frequency divided by said variable divider, and then outputting a control voltage corresponding to comparison results; and a dividing ratio controller for comparing both frequency and phase of a frame synch signal, provided for each frame of data on said optical disk and acquired during a playback period of recorded data, and a clock signal output from said voltage control oscillator, and subsequently controlling said variable divider to have a dividing ratio that is variable depending on comparison results.

2. The optical disk apparatus according to claim 1, wherein, said dividing ratio controller is configured to control the dividing ratio of said variable divider such that both frequency and phase of said clock signal output from said voltage control oscillator synchronize with those of said frame synch signal.

3. The optical disk apparatus according to claim 1, wherein, said dividing ratio controller is configured to control the dividing ratio in said variable divider to be a predetermined value when no frame synch signal is input thereinto.

4. An optical disk apparatus for use with a recordable optical disk, comprising:

clock signal generator means configured to generate standard clock signals for timing data recording such that a location of a data recording restart following an interruption of recording on said optical disk coincides precisely with that of an end of a previous recording, wherein:

said clock signal generator means comprises voltage control oscillator means for generating and then outputting a clock signal having a frequency corresponding to an input control voltage, variable divider means for frequency dividing said clock signal output from said voltage control oscillator means with a dividing ratio that is variable depending on an input control voltage, fixed divider means for frequency dividing a standard clock signal having a predetermined frequency with a predetermined dividing ratio, frequency and phase detector means for comparing both frequency and phase of a first signal generated by being frequency divided by said fixed divider means and a second signal generated by being frequency divided by said variable divider means, and then outputting a control voltage corresponding to comparison results; and dividing ratio controller means for comparing both frequency and phase of a frame synch signal, provided for each frame of data on said optical disk and acquired during playback period of recorded data, and a clock signal output from said voltage control oscillator means, and subsequently controlling said variable divider means to have a dividing ratio that is variable and depends on comparison results.

5. The optical disk apparatus according to claim 4, wherein, said dividing ratio controller means is configured to control the dividing ratio of said variable divider means such that both frequency and phase of said clock signal output from said voltage control oscillator means synchronize with those of said frame synch signal.

6. The optical disk apparatus according to claim 4, wherein, said dividing ratio controller means is configured to control the dividing ratio in said variable divider means to be a predetermined value when no frame synch signal is input thereinto.

7. A method of generating clock signals for timing events in recording new data on an optical disk following an interruption in recording of previous data, such that the recording of new data following said interruption would start substantially where the recording of the previous data ended on the disk, comprising:

comparing both frequency and phase of a) a frame synch signal acquired in the course of playback of data recorded on said disk, and b) a clock signal from an oscillator, to thereby produce a first comparison signal, controlling a dividing ratio of a variable frequency divider as a function of said comparison signal, to thereby provide an output of said variable frequency divider;

comparing said output of said variable frequency divider with a fixed frequency signal to thereby provide a second comparison signal;

using said second comparison signal to control the clock signal from said oscillator; and recording new data on said disk following an interruption in recording of previous data thereon, using the clock signal from said oscillator to cause the recording of new data to start substantially where the recording of previous data ended on the disk.

8. A method as in claim 7 in which said comparing to provide said second comparison signals comprises comparing both frequency and phase of said output of the variable frequency divider with said fixed frequency signal.

9. A method as in claim 8 in which control of the frequency of the clock signal synchronizes the frequency and the phase of said clock sign al with those of the frame synch signal.

10. A method as in claim 9 in which said comparing of a frame synch signal with said clock signal produces a first comparison signal of a first type when no frame synch signal is provided for said comparison, and said controlling the dividing ratio causes the variable frequency divider to have a predetermined dividing ratio in response to said first comparison signal of the first type.

11. A method as in claim 7 in which said control of the clock signal synchronize s the frequency and the phase of said clock signal with those of the frame synch signal.

\* \* \* \* \*